United States Patent
Hung et al.

(10) Patent No.: US 8,176,373 B2
(45) Date of Patent: *May 8, 2012

(54) PRE-CODE DEVICE, AND PRE-CODE SYSTEM AND PRE-CODING METHOD THEREOF

(75) Inventors: Chun-Hsiung Hung, Hsinchu (TW); Wen-Chiao Ho, Tainan (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/042,910

(22) Filed: Mar. 8, 2011

(65) Prior Publication Data

US 2011/0161750 A1    Jun. 30, 2011

Related U.S. Application Data

(63) Continuation of application No. 12/238,719, filed on Sep. 26, 2008, now Pat. No. 7,925,939.

(51) Int. Cl.
*G11C 29/00* (2006.01)
(52) U.S. Cl. ........................................... 714/723
(58) Field of Classification Search ............... 714/718, 714/723, 763, 710
See application file for complete search history.

(56) References Cited

U.S. PATENT DOCUMENTS

| | | | |
|---|---|---|---|
| 5,270,974 A | | 12/1993 | Reddy |
| 5,293,386 A * | | 3/1994 | Muhmenthaler et al. ..... 714/718 |
| 5,844,850 A * | | 12/1998 | Tsutsui et al. ................ 365/200 |
| 5,896,331 A * | | 4/1999 | Crafts ........................... 365/201 |
| 5,996,096 A * | | 11/1999 | Dell et al. ...................... 714/710 |
| 6,035,432 A * | | 3/2000 | Jeddeloh ........................ 714/763 |
| 6,130,442 A * | | 10/2000 | Di Zenzo et al. ............... 257/48 |
| 6,320,804 B2 | | 11/2001 | Dahn |
| 6,330,688 B1 * | | 12/2001 | Brown ........................ 714/6.32 |
| 6,535,995 B1 * | | 3/2003 | Dobbek ...................... 714/6.13 |
| 6,550,023 B1 * | | 4/2003 | Brauch et al. ................... 714/42 |
| 6,717,864 B2 * | | 4/2004 | Leung et al. ............. 365/189.05 |
| 6,735,727 B1 | | 5/2004 | Lee |
| 6,782,458 B1 * | | 8/2004 | Noble .......................... 711/163 |
| 6,910,155 B2 * | | 6/2005 | Ku ................................. 714/30 |
| 7,065,687 B2 | | 6/2006 | Benedix et al. |
| 7,092,289 B1 | | 8/2006 | Wong |
| 7,251,744 B1 * | | 7/2007 | Housty ........................ 714/6.32 |
| 7,269,765 B1 * | | 9/2007 | Charlton et al. .............. 714/710 |
| 7,397,713 B2 | | 7/2008 | Harari et al. |
| 7,414,312 B2 * | | 8/2008 | Nguyen et al. ................ 257/724 |
| 7,434,122 B2 | | 10/2008 | Jo |
| 7,472,331 B2 * | | 12/2008 | Kim ............................. 714/763 |
| 7,571,367 B2 * | | 8/2009 | Selva et al. ................... 714/733 |
| 7,603,593 B2 * | | 10/2009 | Iaculo et al. ................. 714/710 |
| 7,675,776 B2 | | 3/2010 | Allen et al. |
| 7,689,884 B2 * | | 3/2010 | Seuring ........................ 714/729 |

(Continued)

*Primary Examiner* — James C Kerveros
(74) *Attorney, Agent, or Firm* — Thomas|Kayden

(57) ABSTRACT

A pre-code device includes firstly memory circuit, an address decoder, and an alternative logic circuit. The first memory circuit includes a number of memory blocks and at east a replacing block. The memory blocks are pointed by a number of respective physical addresses. The replacing block is pointed by a replacing address. The address decoder decodes an input address to provide a pre-code address. The alternative logic circuit looks up an address mapping table, which maps defect physical address among the physical addresses to the replacing address, to map the pre-code address to the replacing address when the pre-code address corresponds to the defect physical address. The alternative logic circuit correspondingly pre-codes the pre-code data to the replacing block.

18 Claims, 4 Drawing Sheets

U.S. PATENT DOCUMENTS 7,743,303 B2 6/2010 Nobunaga et al.
7,774,643 B2 * 8/2010 Wang .......................... 714/6.13
2006/0031710 A1 2/2006 Jo
2008/0294938 A1 11/2008 Kondo

* cited by examiner

PRE-CODE DEVICE, AND PRE-CODE SYSTEM AND PRE-CODING METHOD THEREOF This application is a continual application of application Ser. No. 12/238,719, filed on Sep. 26, 2008, which is now U.S. Pat. No. 7,925,939.

BACKGROUND OF THE INVENTION

1. Field of the Invention

The invention relates in general to a pre-code system and more particularly to a pre-code system for pre-coding a plurality of pre-code devices at the same time.

2. Description of the Related Art

Along with increasing development of technology, non-volatile memory, such as flash memory, has been wildly used in electronic products. In general, each memory cell, which stores a bit datum, in a flash memory includes a transistor with programmable threshold voltage. The value of a datum stored in a memory cell is decided by the threshold voltage of a transistor included in the memory cell. In an example, when the transistor is programmed with first threshold voltage, the bit datum stored in the memory cell indicates value 1. When the transistor is programmed with second threshold value, the bit datum stored in the memory cell indicates value 0.

Most of the time, the flash memory is used as a reprogrammable in electronic products. However, in some pre-code product application, the flash memory is pre-coded with costumer code in its manufacture process and serves as read only memory after it leaves the factory. Therefore, how to find an efficient way to perform the pre-code operation on the flash memory has become a prominent goal to achieve.

SUMMARY OF THE INVENTION

The invention is directed to a pre-code system including a pre-code machine and a number of pre-code devices. The pre-code machine performs parallel pre-code operation on the pre-code devices at the same time.

According to a first aspect of the present invention, a pre-coding method applied in a pre-code device comprising a replacing block and a plurality of memory blocks, which are respectively pointed by a replacing address and by a plurality of physical addresses, is provided. The pre-coding method includes the following steps. Firstly, obtain a pre-code address and pre-code data. Next, obtain an address mapping table, which maps a defect physical address among the physical addresses to the replacing address. Then determine whether the pre-code address corresponds to the defect physical address. Next, map the pre-code address to the replacing address when the pre-code address corresponds to the defect physical address. After that, pre-code the pre-code data to the replacing block.

According to a second aspect of the present invention, a pre-coding method applied in a pre-code machine for performing pre-code operation on a plurality of pre-code devices is provided. The pre-coding method includes the following steps. Firstly, provide a chip enable signal to enable the plurality of pre-code devices. Next, provide a plurality of pre-code addresses to the respective plurality of pre-code devices. After that, provide a plurality of pre-code data to the respective plurality of pre-code devices.

According to a third aspect of the present invention, a pre-code device is provided. The pre-code device includes firstly memory circuit, an address decoder, and an alternative logic circuit. The first memory circuit includes a number of memory blocks and at east a replacing block. The memory blocks are pointed by a number of respective physical addresses. The replacing block is pointed by a replacing address. The address decoder decodes an input address to provide a pre-code address. The alternative logic circuit looks up an address mapping table, which maps a defect physical address among the physical addresses to the replacing address, to map the pre-code address to the replacing address when the pre-code address corresponds to the defect physical address. The alternative logic circuit correspondingly pre-codes the pre-code data to the replacing block.

According to a fourth aspect of the present invention, a pre-code system is provided. The pre-code system includes a number of pre-code devices and a pre-code machine. The pre-code machine provides a number of chip enable signals to enable the respective plurality of pre-code devices, provides a number of pre-code addresses and a number of pre-code data to the respective pre-code device to pre-code the plurality of pre-code devices with the respective plurality of pre-code data.

The invention will become apparent from the following detailed description of the preferred but non-limiting embodiments. The following description is made with reference to the accompanying drawings.

DETAILED DESCRIPTION OF THE INVENTION

The pre-code system of the embodiment includes a pre-code machine for performing parallel pre-code operation on a number of pre-code devices at the same time. Each of the pre-code devices includes an alternative logic circuit to map a defect physical address pointing to a memory block with defect among a memory circuit to a corresponding replacing address based on an address mapping table.

Figure 1:
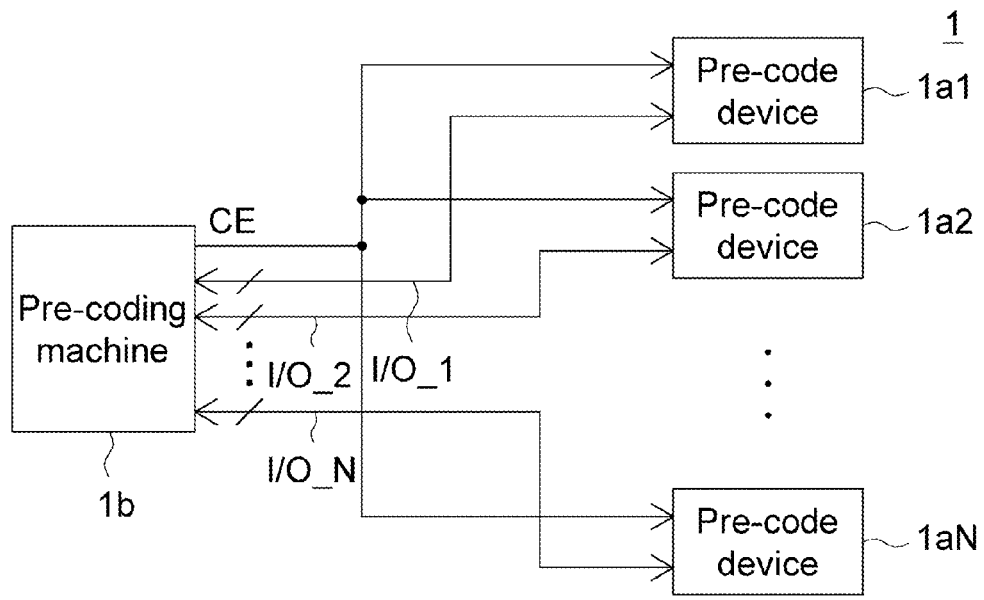
FIG. 1 is a block diagram of a pre-code system 1 according to the embodiment of the invention

Referring to FIG. 1, a block diagram of a pre-code system 1 is shown according to the embodiment of the invention. The pre-code system 1 includes a number of pre-code devices 1a1-1aN and a pre-code machine 1b. N is a natural number. The pre-code machine 1b is connected with the pre-code devices 1a1-1aN for performing pre-code operation on the pre-code devices 1a1-1aN.

When the pre-code operation is performed, the pre-code machine 1b provides chip enable signal CE to the pre-code devices 1a1-1aN for enabling the pre-code devices 1a1-1aN. The pre-code machine 1b further provides pre-code address and pre-code data to the pre-code devices 1a1 to 1aN via communication paths I/O_1 to I/O_N respectively. In an example, each of the communication paths I/O_1 to I/O_N includes 8 sub-paths for providing respective 8 bit data so as to provide the pre-code address and pre-code data to the pre-code devices 1a1 to 1aN. In an example, the pre-code address is coded before it is outputted via the corresponding communication paths I/O_1 to I/O_N.

Since the pre-code operation performed on each of the pre-code devices 1a1-1aN are similar, in the following paragraphs, only the pre-code operation performed on the ith pre-code device 1ai among the pre-code devices 1a1-1aN is cited as example for illustration, wherein i is a natural number smaller or equal to N.

Figure 2:
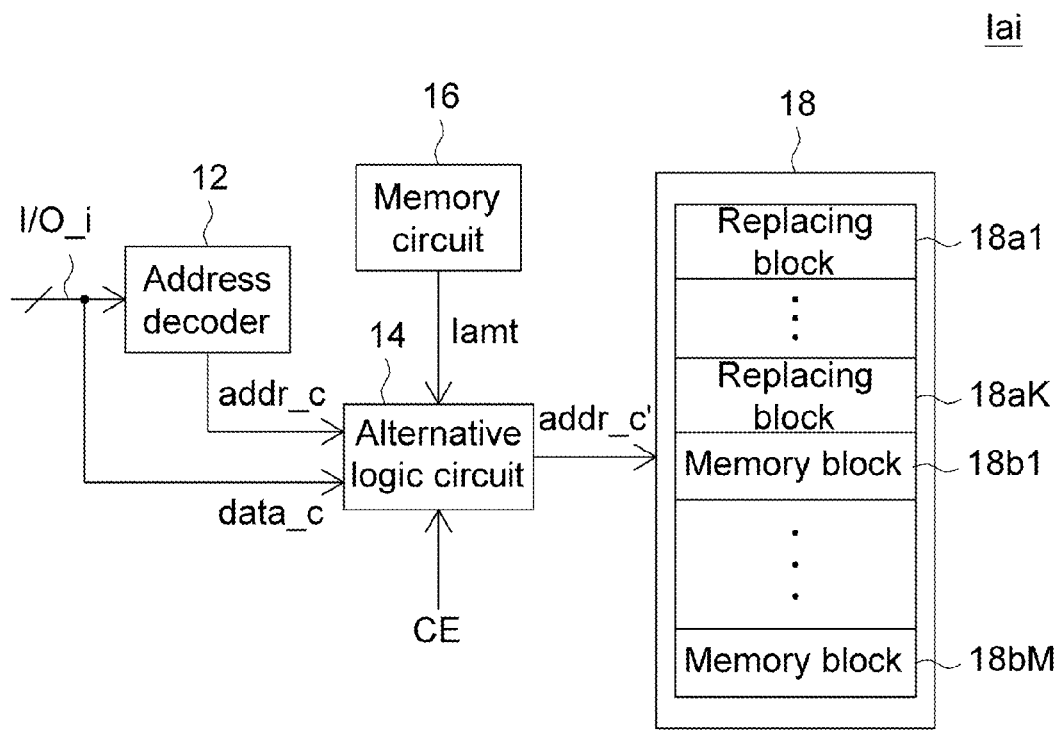
FIG. 2 is a block diagram of a pre-code device 1ai according to the embodiment of the invention.

Please referring to FIG. 2, a block diagram of a pre-code device 1ai is shown according to the embodiment of the invention. The pre-code device 1ai includes an address decoder 12, an alternative logic circuit 14, and memory circuits 16 and 18. The memory circuit 18 includes memory blocks 18b1 to 18bM and replacing block 18a1 to 18aK, wherein M and K are a natural number greater than 1 and a natural number respectively. The memory blocks 18b1 to 18bM are respectively pointed by physical addresses addr_b1 to addr_bM and the replacing blocks 18a1 to 18aK are respectively pointed by replacing addresses addr_a1 to addr_aK.

The address decoder 12 receives the coded pre-code address via the communication path I/O_i and performs decoding operation on the input address to obtain a pre-code address addr_c.

The alternative logic circuit 14 receives the pre-code data data_c via the communication path I/O_i. The alternative logic circuit 14 downloads information of address mapping table lamt from memory circuit 16 when the pre-code device 1ai is enabled by the chip enable signal CE. The address mapping table records the defect physical address, which points to the memory block with defect, among the physical addresses addr_b1 to addr_bM and accordingly maps the defect physical address to a corresponding replacing address.

In an example, the memory block 18bj among the memory blocks 18b1 to 18bM is a memory block with defect and the rest memory blocks among the memory blocks 18b1 to 18bM are normal memory blocks, wherein j is a natural number smaller or equal to M. Thus, the corresponding physical address addr_bj pointing to the defect memory block 18bj is a defect physical address and the address mapping table maps the defect physical address adder_bj to the replacing address addr_a1. The corresponding physical addresses pointing to the normal memory blocks are normal physical addresses.

The alternative logic circuit 14 receives pre-code address addr_c and determines whether the pre-code address addr_c corresponds to the defect physical address addr_bj. When the pre-code address addr_c corresponds to the defect physical address addr_bj, the alternative logic circuit 14 maps the pre-code address addr_c to the corresponding replacing address addr_a1 to obtain a mapped pre-code address addr_c' and accordingly codes the corresponding replacing block 18a1 with the pre-code data data_c.

When the pre-code address addr_c corresponds to any of the normal physical addresses among the physical address 18b1 to 18bM, the alternative logic circuit 14 maps the pre-code address addr_c to the corresponding normal physical address to obtain the mapped pre-code address addr_c' and accordingly pre-codes the corresponding memory block with the pre-code data data_c.

By performing the operation mentioned above, the pre-code machine 1b can pre-code the pre-code device 1aj with program code. Similar operations are also performed on other pre-code devices among the pre-code system 1, such that, the pre-code machine 1b can pre-code the pre-code device 1a1 to 1aN with substantially the same program code.

Figure 3:
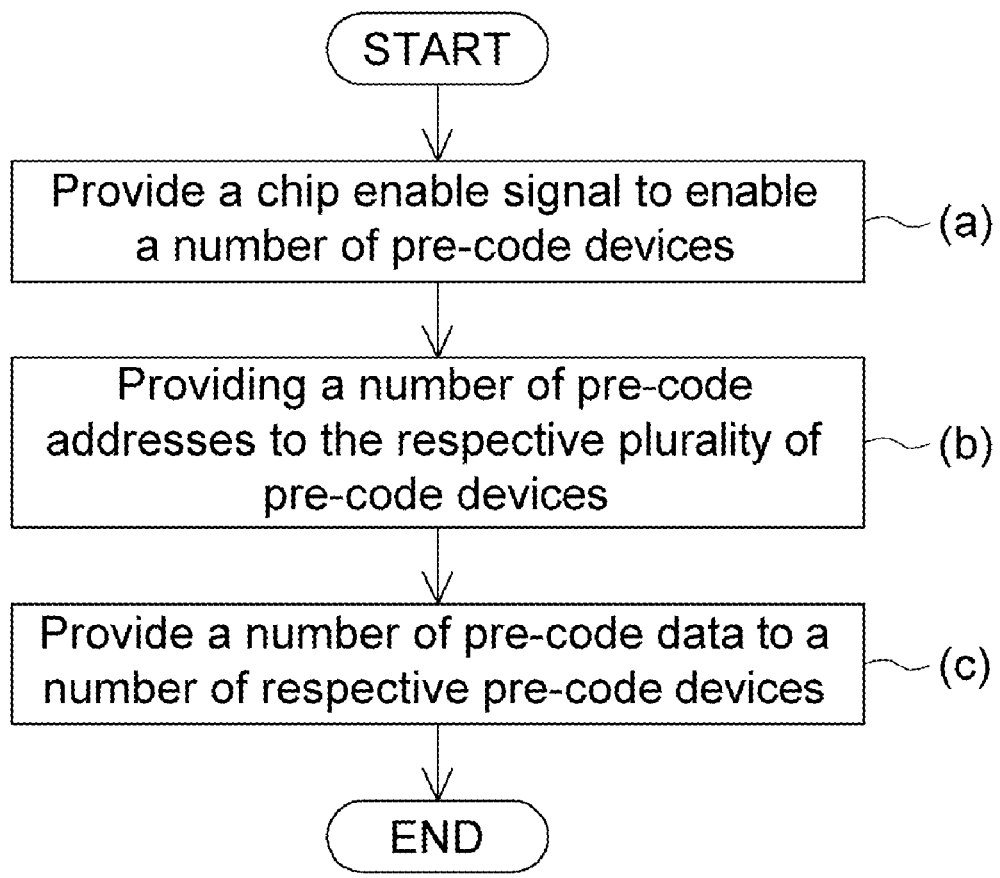
FIG. 3 is a flow chart of a pre-coding method applied in the pre-code system 1 shown in FIG. 1 according to the embodiment of the invention.

Referring to FIG. 3, a flow chart of a pre-coding method applied in the pre-code system 1 is shown according to the embodiment of the invention. The pre-coding method includes the following steps. Firstly, performing steps (a), the pre-code machine 1b provides the chip enable signal CE to enable the pre-code devices 1a1 to 1aN. Next performing step (b), the pre-code machine 1b provides pre-code addresses to the pre-code devices 1a1 to 1aN through the communication paths I/O_1 to I/O_N respectively.

Then performing step (c), the pre-code machine 1b provides pre-code data to the pre-code devices 1a1 to 1aN through the communication paths I/O_1 to I/O_N respectively so as to pre-code the pre-code devices 1a1 to 1aN with corresponding code.

Figure 4:
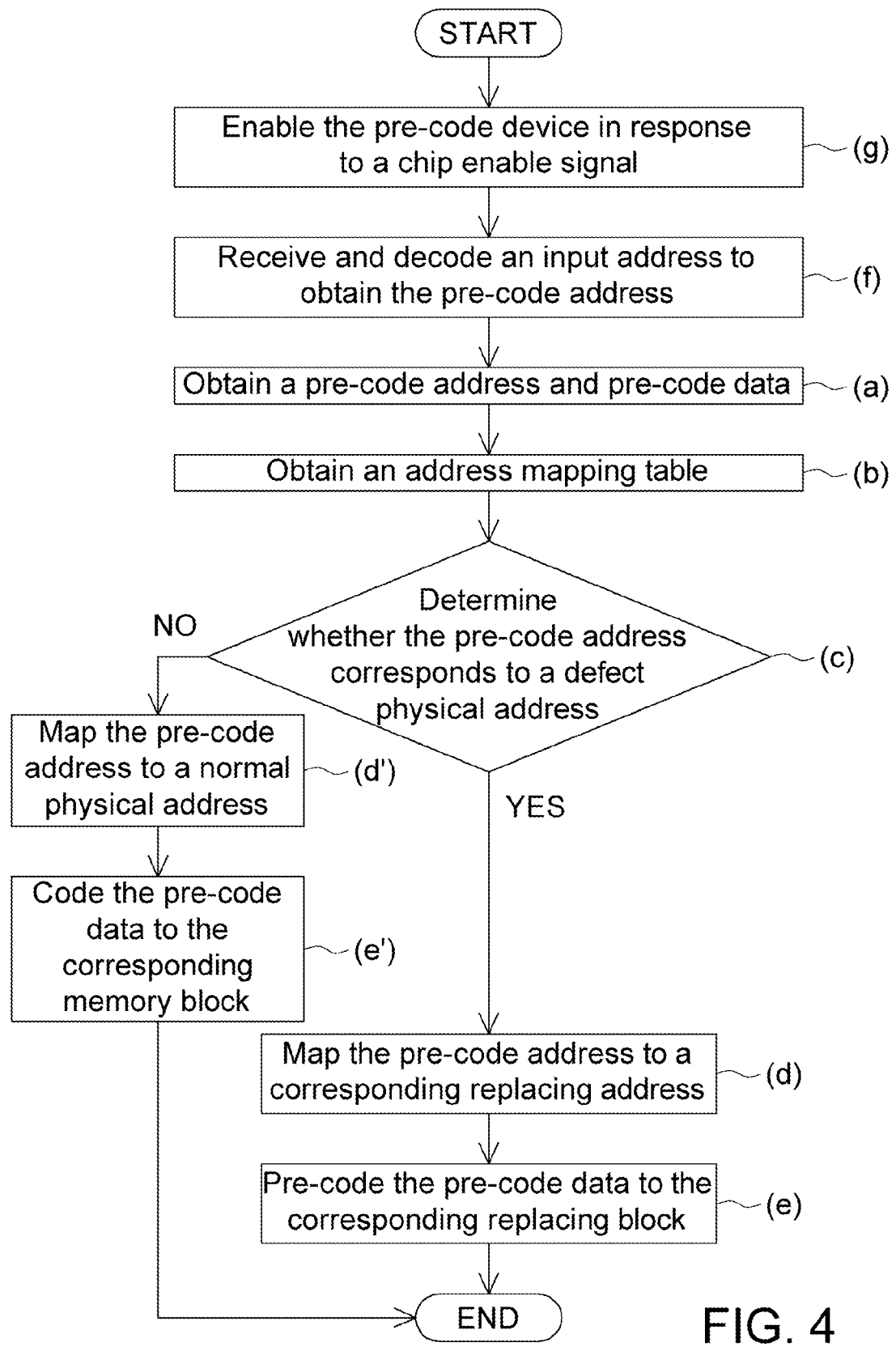
FIG. 4 is a flow chart of a pre-coding method applied in the pre-code device 1ai shown in FIG. 2 according to the embodiment of the invention.

Referring to FIG. 4, a pre-coding method applied in the pre-code device 1ai is shown according to the embodiment of the invention. The pre-coding method includes the following steps. Firstly, performing step (a), the address decoder 12 obtains the pre-code address addr_c and the alternative logic circuit 14 receives the pre-code data data_c. The address decoder 12 further provides the pre-code address addr_c to the alternative logic circuit 14.

Next, performing step (b), the alternative logic circuit 14 downloads the information of the address mapping table lamt from the memory circuit 16 to obtain the address mapping table, which maps the defect physical address addr_bj among the physical addresses addr_b1 to addr_bM to the replacing address addr_a1.

Then performing step (c), the alternative logic circuit 14 determines whether the pre-code address addr_c corresponds to the defect physical address addr_bj; if so, performing step (d), to alternative logic circuit 14 maps the pre-code address addr_c to the replacing address addr_a1 to obtain the mapped pre-code address addr_c'. After that, performing step (e), the alternative logic circuit 14 pre-codes the pre-cod data data_c to the replacing block 18a1 pointed by the mapped pre-code address addr_c', that is, the replacing address addr_a1.

In an example, after step (c), if the alternative logic circuit 14 determines the pre-code address addr_c correspond to one of the normal physical addresses, the pre-coding method further includes step (d'), the alternative logic circuit 14 maps the pre-code address addr_c to the corresponding normal physical address to obtain the mapped pre-code address addr_c'. After that, performing step (e'), the alternative logic circuit 14 pre-codes the pre-code data data_c to the memory block pointed by mapped pre-code address addr_c', that is, the corresponding normal block pointed by the normal physical address.

In an example, before step (a), the pre-coding method further includes steps (f), the address decoder 12 receives and decoding an input address to obtain the pre-code address addr_c.

In an example, before step (a), the pre-coding method further includes steps (g), the pre-code device 1ai is enabled in response to the chip enable signal CE.

Figure 5:
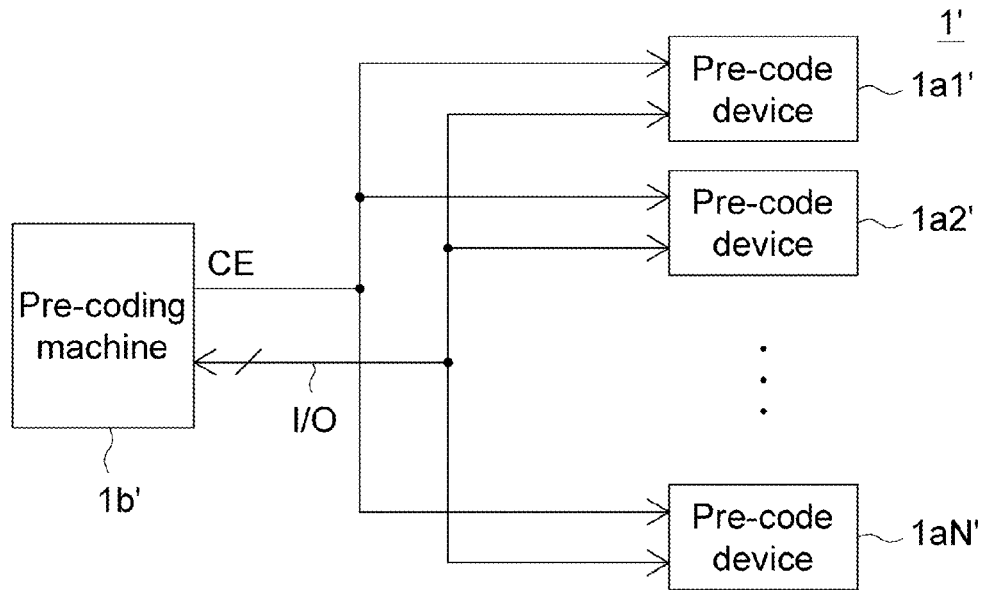
FIG. 5 is a block diagram of a pre-code system 1' according to the embodiment of the invention.

Although only the case that the pre-code machine 1b provides pre-code address and pre-code data to the pre-code devices 1a1 to 1aN through the communication paths I/O_1 to I/O_N respectively is cited as an example mentioned above, the pre-code machine 1b does not limited thereto. In other example, as shown in FIG. 5, the pre-code machine 1b can also provides pre-code address and pre-code data to the pre-code devices 1a1 to 1aN through only a communication path I/O. In other words, the pre-code machine 1b pre-codes the same pre-code data to substantially the same memory blocks in all the pre-code devices 1a1 to 1a substantially at the same time.

Although only the case that the jth memory block 18*bj* of the memory circuit 18 is the only defect memory block among the memory blocks 18*b*1 to 18*b*M is cited as an example mentioned above, the memory circuit 18 is not thereto. In other example, the memory circuit 18 can also have two or more than two defect memory blocks and the address mapping table accordingly maps the defect physical addresses pointing to those defect memory blocks to the corresponding replacing addresses. In an example, the number of defect memory blocks is smaller than or equal to K.

Figure 6:
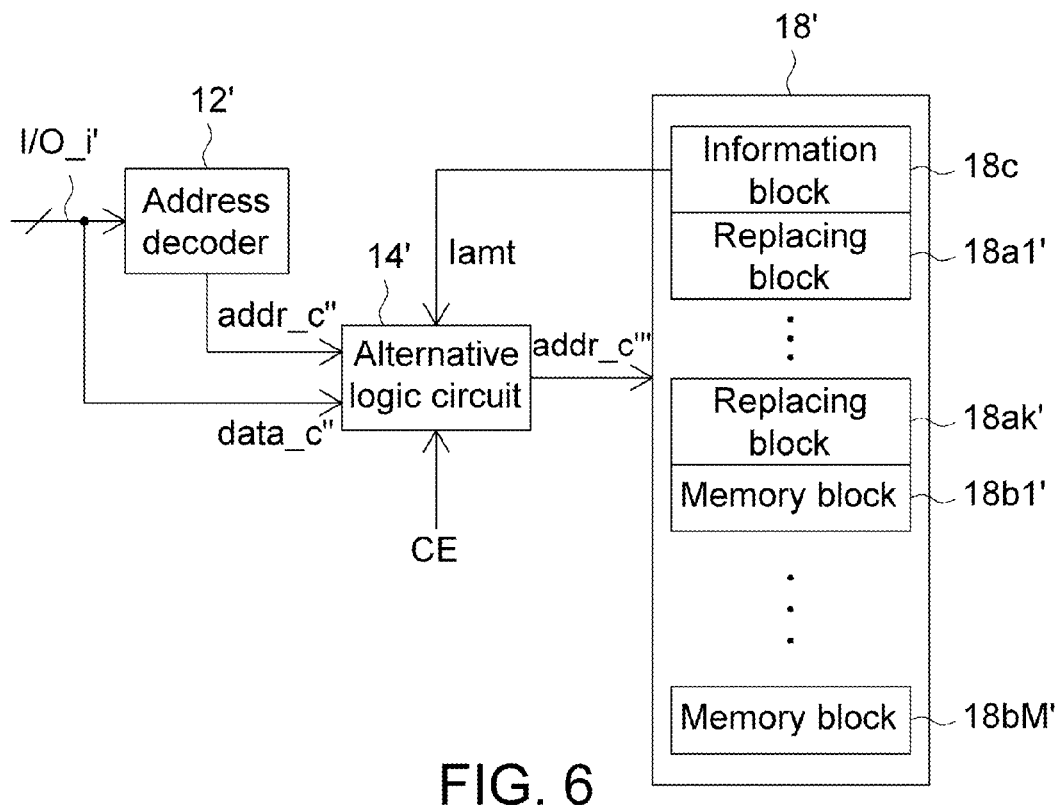
FIG. 6 is a block diagram of a pre-code device 1ai' according to the embodiment of the invention.

In the present embodiment, only the case that each of the pre-code devices 1*a*1 to 1*a*N includes the memory circuit 16 for storing the information of the address mapping table lamt is cited as an example mentioned above, the pre-code device 1*a*1 to 1*a*N are not limited thereto. In other example, as shown in FIG. 6, the information of the address mapping table lamt is stored in a information block 18*c* in the memory circuit 18'. Therefore, the alternative logic circuit 14' downloads the information of the address mapping table lamt from the information block 18*c* of the memory circuit 18', rather than the memory circuit 16.

In the present embodiment, a pre-code machine performs parallel pre-code operation on a number of pre-code devices at the same time. Thus, the pre-code system of the embodiment can effectively pre-code a number of pre-code devices at the same time.

Besides, each of the pre-code devices of the pre-code system includes an alternative logic circuit for mapping defect physical address to a corresponding replacing address and pre-coding the pre-code data to a corresponding replacing block in response to the pre-code address. Thus, by applying the address mapping technique, the pre-code system of the embodiment can effectively pre-code the pre-code devices with defect.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A coding method applied in a coding system, the coding system comprising a plurality of memory chips, the coding method comprising:
   providing a plurality of addresses to the respective memory chips; and
   providing a plurality of data to the respective memory chips to code the memory chips with respective data at the same time, wherein all the data have the same data value.

2. The coding method according to claim 1, wherein each of the memory chips comprises a replacing block which is pointed by a replacing address, and a plurality of memory blocks which are respectively pointed by a plurality of physical addresses, the coding method further comprises:
   obtaining by each of the memory chips a coding address and coding data from the address and the data provided by the coding machine;
   obtaining by each of the memory chips an address mapping table, which maps a defect physical address among the physical addresses to the replacing address;
   determining by each of the memory chips whether the coding address corresponds to the defect physical address; and
   when the coding address corresponds to the defect physical address in any one of the memory chips, mapping the coding address to the replacing address and coding the coding data to the replacing block in the corresponding memory chip.

3. The coding method according to claim 2, further comprising:
   when the coding address corresponds to a normal physical address among the physical addresses in any one of the memory chips, mapping the coding address to the normal physical address and coding the coding data to a memory block pointed by the normal physical address in the corresponding memory chip.

4. The coding method according to claim 2, wherein the step of obtaining by each of the memory chips the coding address and the coding data further comprises:
   receiving and decoding the address provided by the coding machine to obtain the coding address by each of the memory chips.

5. The coding method according to claim 2, wherein each of the memory chips is enabled by a chip enable signal and the coding method further comprises downloading information of the address mapping table from a memory circuit of each of the memory chips when enabled by the corresponding chip enable signal.

6. The coding method according to claim 1, wherein the addresses have the same address value.

7. A coding system comprising:
   at least one communication path for communicating a plurality of memory chips; and
   a coding machine, for providing a plurality of addresses and a plurality of data to the respective memory chips via the at least one communication path to code the memory chips with respective data at the same time, wherein all the data have the same data value.

8. The coding system according to claim 7, wherein each of the memory chips comprises:
   a first memory circuit, comprising:
      a plurality of memory blocks, pointed respectively by a plurality of physical addresses; and
      a replacing block, pointed by a replacing address;
   an address decoder, for decoding one of the addresses to provide a coding address; and
   an alternative logic circuit which maps a defect physical address among the physical addresses to the replacing address, and maps the coding address to the replacing address when the coding address corresponds to the defect physical address.

9. The coding system according to claim 8, wherein each of the memory chips further comprises:
   a second memory circuit, for providing an address mapping table to the alternative logic circuit, wherein the address mapping table maps the defect physical address among the physical addresses to the replacing address.

10. The coding system according to claim 9, wherein the first memory circuit further comprises an information block for storing the address mapping table to the alternative logic circuit.

11. The coding system according to claim 9, wherein each of the memory chips is enabled by a chip enable signal from the coding machine and the alternative logic circuit downloads information of the address mapping table from the second memory circuit when enabled by the corresponding chip enable signal.

12. The coding system according to claim 7, wherein the addresses have the same address value.

13. A pre-coding system comprising:
    at least one communication path for communicating a plurality of pre-code chips; and a pre-coding machine, for providing a plurality of data to the respective pre-code chips via the at least one communication path to pre-code the pre-code chips with respective data.

14. The pre-coding system according to claim 13, wherein the pre-coding machine pre-codes the pre-code chips at the same time.

15. The pre-coding system according to claim 13, wherein the pre-coding machine further provides a plurality of addresses to the respective pre-code chips via the at least one communication path, each of the pre-code chips comprises:
   a first memory circuit, comprising:
      a plurality of memory blocks, pointed respectively by a plurality of physical addresses; and
      a replacing block, pointed by a replacing address;
   an address decoder, for decoding one of the addresses to provide a pre-coding address; and
   an alternative logic circuit which maps a defect physical address among the physical addresses to the replacing address, and maps the pre-coding address to the replacing address when the pre-coding address corresponds to the defect physical address.

16. The pre-coding system according to claim 15, wherein each of the pre-code chips further comprises:
   a second memory circuit, for providing an address mapping table to the alternative logic circuit, wherein the address mapping table maps the defect physical address among the physical addresses to the replacing address.

17. The pre-coding system according to claim 16, wherein the first memory circuit further comprises an information block for storing the address mapping table to the alternative logic circuit.

18. The pre-coding system according to claim 16, wherein each of the pre-code chips is enabled by a chip enable signal from the pre-coding machine and the alternative logic circuit downloads information of the address mapping table from the second memory circuit when enabled by the corresponding chip enable signal.

* * * * *